(12) United States Patent
Whitefield et al.

(10) Patent No.: US 8,599,524 B2
(45) Date of Patent: Dec. 3, 2013

(54) SURFACE MOUNT SPARK GAP

(75) Inventors: David Scott Whitefield, Andover, MA (US); Kenneth Warren, Anamosa, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 438 days.

(21) Appl. No.: 12/966,065

(22) Filed: Dec. 13, 2010

(65) Prior Publication Data

US 2011/0149452 A1 Jun. 23, 2011

Related U.S. Application Data

(63) Continuation of application No. PCT/US2009/069448, filed on Dec. 23, 2009.

(51) Int. Cl.
*H02H 9/00* (2006.01)
*H05K 3/02* (2006.01)

(52) U.S. Cl.
USPC ............ 361/56; 174/250; 361/91.1; 361/111; 361/118

(58) Field of Classification Search
USPC ................ 361/6, 54, 56, 91.1, 111, 117, 118, 361/679.08, 748, 781, 278; 174/32, 250, 174/260, 350, 359
See application file for complete search history.

(56) References Cited

U.S. PATENT DOCUMENTS

| | | | |
|---|---|---|---|
| 5,969,924 A * | 10/1999 | Noble | 361/56 |
| 6,002,569 A * | 12/1999 | Horvath | 361/111 |
| 6,285,535 B1 * | 9/2001 | Nakamura | 361/56 |
| 6,355,958 B1 * | 3/2002 | Orchard-Webb | 257/355 |
| 6,493,198 B1 * | 12/2002 | Arledge et al. | 361/56 |
| 6,721,157 B2 | 4/2004 | Shin | |
| 7,161,785 B2 * | 1/2007 | Chawgo | 361/119 |
| 7,869,180 B2 * | 1/2011 | Cheung et al. | 361/128 |
| 2007/0216015 A1 * | 9/2007 | Schnitt et al. | 257/692 |
| 2009/0200063 A1 * | 8/2009 | Omerovic | 174/250 |
| 2010/0314161 A1 * | 12/2010 | Oh et al. | 174/257 |

OTHER PUBLICATIONS

International Search Report from corresponding International Application No. PCT/US2009/069448 dated Aug. 26, 2010.

* cited by examiner

*Primary Examiner* — Hoa C Nguyen
*Assistant Examiner* — Amol Patel
(74) *Attorney, Agent, or Firm* — Lando & Anastasi, LLP

(57) ABSTRACT

A spark gap device includes an optional insulating layer formed on a substrate, a metal layer formed on a surface of the insulating layer, a solder resist layer formed on a surface of the metal layer, and first and second contacts. The metal layer includes a central portion and a peripheral portion separated by an air gap that surrounds the central portion of the metal layer and exposes the insulating layer. The solder resist layer includes a central portion disposed on the central portion of the metal layer having a first opening exposing a central region of the central portion of the metal layer, and a peripheral portion disposed on the peripheral portion of the metal layer having a second opening exposing a peripheral region of the peripheral portion of the metal layer. The first contact is formed in the first opening and the second contact is formed in the second opening.

20 Claims, 5 Drawing Sheets

SURFACE MOUNT SPARK GAP

CROSS-REFERENCE TO RELATED APPLICATIONS

This application is a continuation of and claims priority under 35 U.S.C. §§120 and 363 to International Application No. PCT/US2009/069448, filed Dec. 23, 2009 and entitled "SURFACE MOUNT SPARK GAP," which is herein incorporated by reference in its entirety.

BACKGROUND OF THE INVENTION

1. Field of the Invention

The present invention is generally directed to spark gap devices, and more particularly to spark gap devices that may be surface mounted to a printed circuit board or a chip carrying substrate.

2. Discussion of the Related Art

Spark gap devices have been used for many years to protect equipment from voltage surges that may occur due to a lightning strike or other types of electrostatic discharge (ESD) events. For example, spark gaps are conventionally used on telephone lines, power lines, and antenna feed-lines to protect a building and/or circuits connected thereto from the effects of a lightning strike or other ESD event.

SUMMARY OF THE INVENTION

Embodiments of the present invention are directed to a spark gap device that may be surface mounted to a Printed Circuit Board (PCB) or chip carrying substrate. The spark gap device may be formed using conventional semiconductor fabrication equipment and techniques, and may be encapsulated in a mold compound without impacting the operation of the device.

In accordance with one aspect of the present invention, a spark gap device is provided. The spark gap device comprises a substrate, a metal layer formed over the substrate, a solder resist layer disposed on an exposed surface of the metal layer, and first and second contacts. The metal layer includes a central portion and a peripheral portion that are separated by a gap where no metal from the metal layer is present. The gap surrounds the central portion of the metal layer. The solder resist layer includes a central portion disposed on the central portion of the metal layer and a peripheral portion disposed on the peripheral portion of the metal layer. The central portion of the solder resist layer includes a first opening exposing a central region of the central portion of the metal layer, and the peripheral portion of the solder resist layer includes a second opening exposing a peripheral region of the peripheral portion of the metal layer. The first contact is formed in the first opening of the solder resist layer and contacts the central region of the central portion of the metal layer, and the second contact is formed in the second opening of the solder resist layer and contacts the peripheral region of the peripheral portion of the metal layer.

In accordance with one embodiment in which the substrate is formed from a semiconductor material, an insulating layer is formed on a surface of the substrate between the substrate and the metal layer, and the gap exposes the insulating layer.

In accordance with a further embodiment of the present invention, the spark gap device may be mounted to a mounting substrate that includes a first contact that is electrically connected to the first contact of the spark gap device, and a second contact that is electrically connected to the second contact of the spark gap device. The second contact of the spark gap device surrounds a periphery of the substrate of the spark gap device and together with the second contact of the mounting substrate forms a substantially air-tight seal.

According to another aspect of the present invention, a method of forming a spark gap device is provided. The method comprising acts of forming a metal layer over a substrate; removing a portion of the metal layer to define a substantially circular gap where no metal from the metal layer is present, the gap surrounding a central portion of the metal layer and separating the central portion of the metal layer from a peripheral portion of the metal layer that coaxially surrounds the gap; forming a solder resist layer on an exposed surface of the central portion of the metal layer and the peripheral portion of the metal layer; removing a portion of the solder resist layer to expose a central region of the central portion of the metal layer and a peripheral region of the peripheral portion of the metal layer; forming a first contact on the exposed central region of the central portion of the metal layer to provide a first electrode for the spark gap device; and forming a second contact on the exposed peripheral region of the peripheral portion of the metal layer to provide a second electrode for the spark gap device.

According to one embodiment in which the substrate is formed from a semiconductor material, the method may further comprise an act of forming an insulating layer on a surface of the substrate, wherein the act of forming the metal layer over the substrate includes forming the metal layer on an exposed surface of the insulating layer, and wherein the act of removing the portion of the metal layer includes removing the portion of the metal layer down to the insulating layer.

According to yet another embodiment, the method may further comprise acts of mounting the spark gap device to a mounting substrate having a first central contact and a second peripheral contact, forming a first electrical connection between the first contact of the spark gap device and the first central contact of the mounting substrate, and forming a second electrical connection between the second contact of the spark gap device and the second peripheral contact of the mounting substrate, wherein the act of forming the second electrical connection forms a substantially air-tight seal around a periphery of the spark gap device.

According to a further embodiment, the method may further comprise an act of encapsulating the spark gap device in a molding compound while preventing the ingress of the molding compound in the gap.

BRIEF DESCRIPTION OF THE DRAWINGS

Various aspects of at least one embodiment are discussed below with reference to the accompanying figures, which are not intended to be drawn to scale. In the figures, each identical or nearly identical component that is illustrated in various figures is represented by a like numeral. For purposes of clarity, not every component may be labeled in every figure. In the drawings.

DETAILED DESCRIPTION

Figure 1:
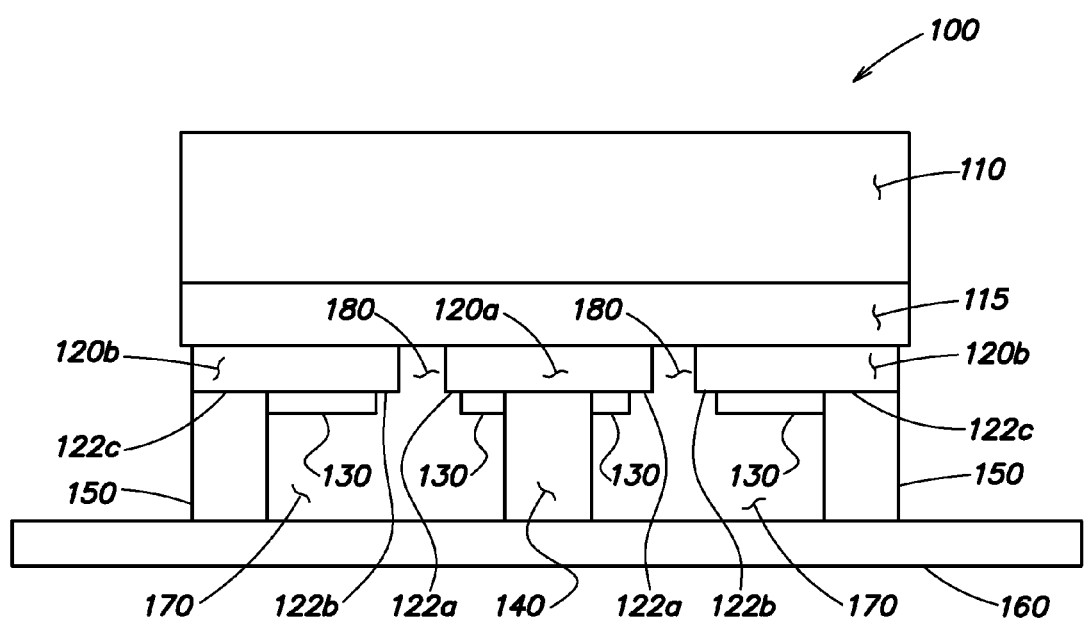
FIG. 1 is a cross-sectional view of a surface mountable spark gap device in accordance with one embodiment of the present invention.

The systems, devices, and methods described herein are not limited in their application to the details of construction and the arrangement of components set forth in the description or illustrated in the drawings. The invention is capable of other embodiments and of being practiced or of being carried out in various ways. Also, the phraseology and terminology used herein is for the purpose of description and should not be regarded as limiting. The use of "including," "comprising," "having" "containing" "involving" and variations thereof herein, is meant to encompass the items listed thereafter and equivalents thereof as well as additional items.

Figure 2:
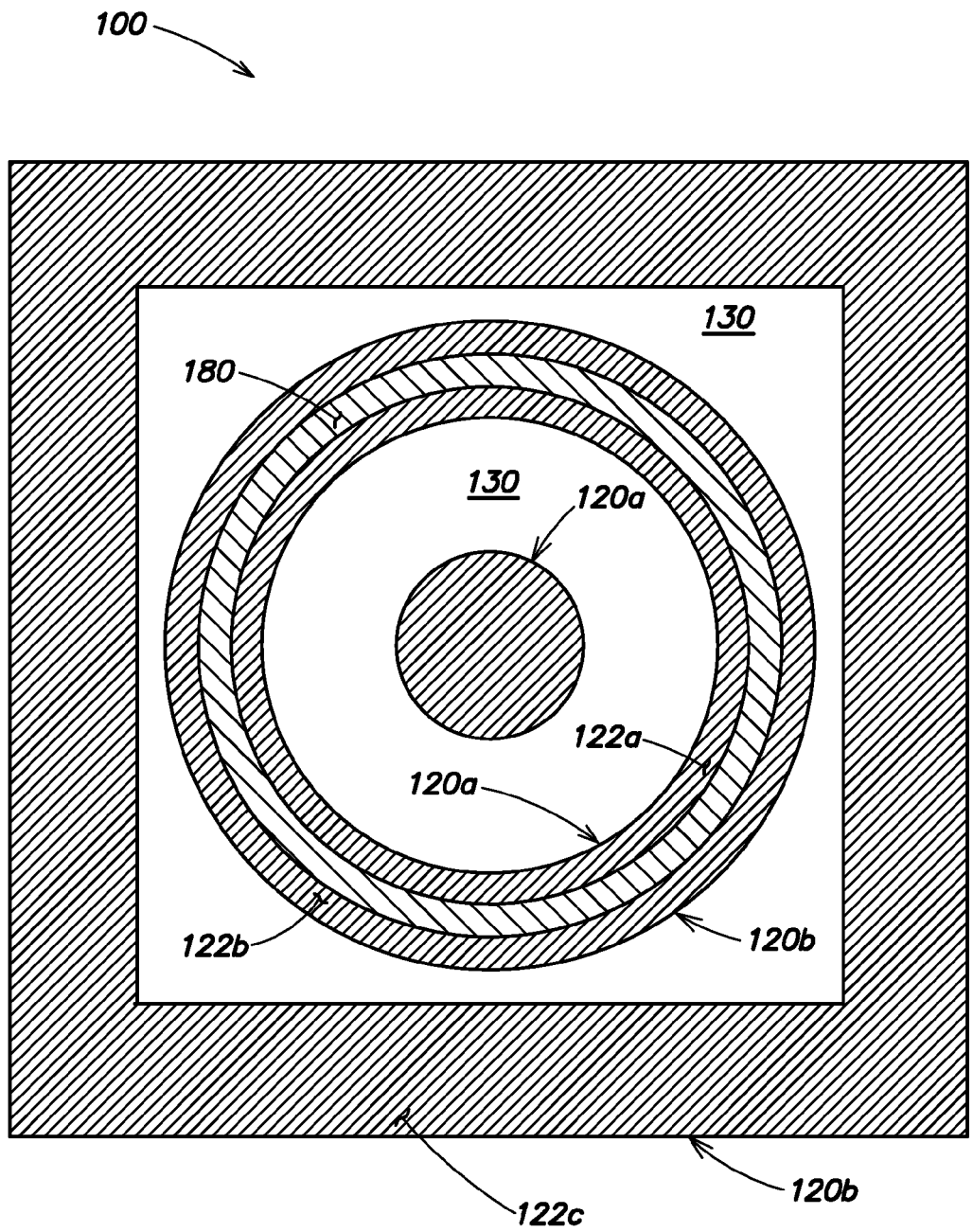
FIG. 2 is a bottom view the surface mountable spark gap device of FIG. 1.

Various aspects of the present invention are now described with respect to FIGS. 1-2, in which FIG. 1 illustrates a vertical cross-sectional view of a surface mountable spark gap device in accordance with one embodiment of the present invention, and in which FIG. 2 illustrates a bottom view of the surface mountable spark gap device shown in FIG. 1. As used herein, the expression "surface mountable" means that the spark gap device may be mounted to a Printed Circuit Board (PCB) or other mounting structure using surface mount technology conventionally used to manufacture semiconductor circuits.

As shown in FIGS. 1 and 2, the surface mountable spark gap device 100 comprises a substrate 110 upon which various layers are formed, including an optional insulating layer 115, a metal layer 120, a solder resist layer 130, and contacts 140, 150. In accordance with one embodiment of the present invention, the surface mountable spark gap device 100 is approximately 0.5 mm long, by approximately 0.5 mm wide, and approximately 0.2 mm thick.

As best shown in FIG. 2, the metal layer 120, which in one embodiment is disposed on the insulating layer 115, includes a central portion 120a and a peripheral portion 120b, with the peripheral portion 120b being formed coaxially about, and spaced apart from, the central portion 120a. Each of the central portion 120a and the peripheral portion 120b forms an electrode of the spark gap device 100. Between the central portion 120a and the peripheral portion 120b is a spark gap 180 where no metal is present. As shown, the spark gap 180 coaxially surrounds the central portion 120a and electrically separates the central portion 120a of the metal layer 120 from the peripheral portion 120b of the metal layer 120.

A solder resist layer 130 having a thickness of between approximately 0.5-10. microns (0.5-10µ meters) is disposed on the metal layer 120 except in those regions where the contacts 140, 150 are formed. The solder resist layer 130 prevents any solder or other contact material (such as a conductive epoxy) that is used to form the contacts 140, 150 from flowing into the spark gap 180 during a reflow operation or other bonding operation when the spark gap device 100 is mounted to a PCB 160. Without the presence of the solder resist layer 130, it is possible that contact material could form a conductive pathway between the central portion 120a and the peripheral portion 120b of the metal layer 120. In accordance with one embodiment, the solder resist layer 130 is approximately 1 micron (1µ meter) thick and is formed from a layer of SU8 polymer in a well known manner, although as discussed further in detail below, other suitable materials and thicknesses may be used.

As shown most clearly in FIG. 1, the solder resist layer 130 may be spaced slightly apart from an inner edge 122b of the peripheral portion 120b of the metal layer 120 and from the outer edge 122a of the central portion 120a of the metal layer 120 to ensure that no solder resist material enters the spark gap 180. For example, in one embodiment, the solder resist layer 130 is spaced apart from the inner edge 122b of the peripheral portion 120b of the metal layer 120 and from the outer edge 122a of the central portion 120a of the metal layer 120 by approximately 20 microns (20µ meters). A central contact 140 is formed on the central portion 120a of the metal layer 120 where no solder resist is present. Similarly, a peripheral contact 150 is formed on an outer edge 122c of the peripheral portion 120b of the metal layer 120 where no solder resist is present. Although not visible in FIG. 1, the central contact 140 is electrically connected to a first contact formed on an upper surface of the PCB 160, and the peripheral contact 150 is electrically connected to a second contact that is also formed on the upper surface of the PCB 160. The second contact is spaced apart from the first contact and surrounds the first contact.

Upon mounting the spark gap device 100 to a PCB 160 or other mounting structure, the peripheral contact 150, which extends around the periphery of the surface mountable spark gap device 100, forms a substantially air tight seal that prevents any molding compound (discussed further below with respect to FIG. 5) from entering the cavity 170 that is defined between the central contact 140 and the peripheral contact 150. In accordance with an embodiment of the present invention, the cavity 170 may contain ambient air that is entrapped during mounting of the spark gap device 100 to the PCB 160 or other mounting structure. Preferably mounting of the spark gap device 100 is performed in a relatively dry environment, to avoid trapping an excess amount of water vapor within the cavity 170. It should be appreciated that the cavity 170 may alternatively be filled with another gas or mixture of gasses, for example, an inert gas, such as argon or nitrogen, or a non-inert gas with suitable electrical properties. Alternatively still, the mounting of the spark gap device 100 to the PCB 160 or other mounting structure could be performed in a vacuum environment.

In accordance with one embodiment, the substrate 110 may be formed from a semiconductor material, such as semi-insulating silicon, although it should be appreciated that other materials may be used. For example, other suitable materials may include GaAs, glass, ceramic materials, or even plastic. Where the substrate 110 is formed from a semiconductor material (or other type of material that is not highly non-conductive), an insulating layer 115 having a thickness between about 1-20 microns (1-20µ meters) may be formed on a surface of the substrate 110 between the substrate 110 and the metal layer 120 to prevent any conduction between the central portion 120a of the metal layer 120 and the surrounding peripheral portion 120b of the metal layer 120 via the substrate 110. In accordance with one embodiment in which semi-insulating silicon is used to form the substrate 110, the insulating layer 115 may be formed in a well known manner from a layer of silicon dioxide having a thickness of approximately 10 microns (10μ meters). It should be appreciated that other types of insulating materials and thicknesses may be used to form the insulating layer 115. Where the substrate is formed from a highly non conductive material, such as glass, or non-conductive ceramic materials, the presence of the insulating layer 115 may not be needed.

Figure 3A:
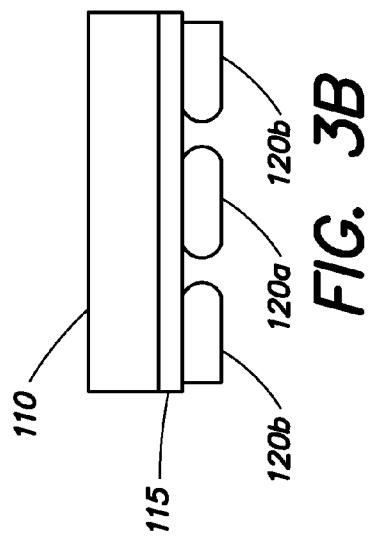
FIG. 3a is a partial cross-sectional view of a surface mountable spark gap device in accordance with an embodiment of the present invention in which sidewalls of the metal layer have a slightly tapered shape.
Figure 3B:
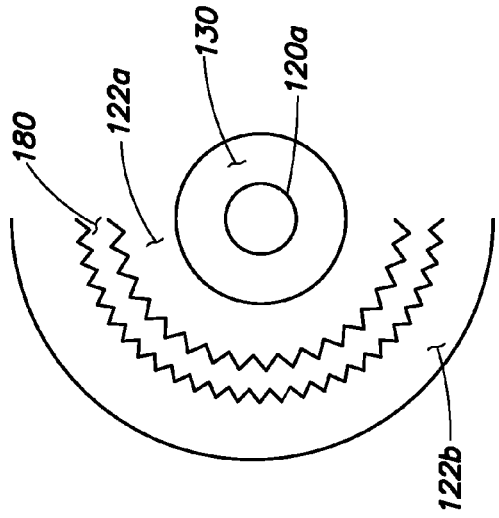
FIG. 3b is a partial cross-sectional view of a surface mountable spark gap device in accordance with another embodiment of the present invention in which sidewalls of the metal layer have an arcuate shape.

In accordance with one embodiment, the metal layer 120 has a thickness of approximately 1 micron (1μ meter) or more, and may be formed by electroplating a suitable metal, such as a mixture of titanium and tungsten, on a surface of the insulating layer 115. Although other techniques may be used to form the metal layer 120, such as evaporation or sputtering, electroplating is better suited to forming thicker layers. Other suitable metals that may be used include platinum, pure titanium, pure tungsten, or nickel. Preferably, the material selected for the metal layer 120 should have a high melting temperature and be of a sufficient thickness, given the temperatures to which the metal layer 120 may be subjected during a lightning strike or other type of ESD event. Although as shown in FIG. 1 the sidewalls of the metal layer 120 adjacent the spark gap 180 are generally parallel to one another and substantially perpendicular to the surface of the insulating layer 115 on which the metal layer 120 is formed, it should be appreciated that the present invention is not so limited. For example, where the spark gap 180 is formed by etching the metal layer 120, the sidewalls of the metal layer 120 adjacent the spark gap 180 may have a slight taper, as shown in FIG. 3a. Moreover, the sidewalls of the metal layer 120 adjacent the spark gap 180 may have other shapes, such as the arcuate shaped sidewalls depicted in FIG. 3b, as the present invention is not limited to sidewalls having a particular shape.

In accordance with an embodiment of the invention, the spark gap 180 is substantially circular in shape, substantially uniform in dimension and substantially smooth in contour, and has a width of approximately 6 to 10 microns (6-10μ meters). It should be appreciated that the spark gap 180 need not be circular, as other shapes, such as an ellipse, could alternatively be used. However, the spark gap 180 should have a generally arcuate shape to avoid the presence of sharp edges or corners, which could create preferred zones for arcing between the central portion 120a and the peripheral portion 120b of the metal layer 120 during a lightning strike or other type of ESD event. Such sharp edges or corners could reduce the ability of the surface mountable spark gap device to withstand a large number of ESD events.

Figure 3C:
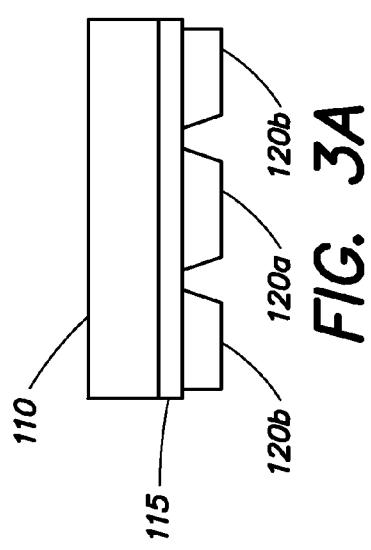
FIG. 3c is a partial bottom view of a surface mountable spark gap device in accordance with an embodiment of the present invention in which the spark gap has a scalloped contour.
Figure 3D:
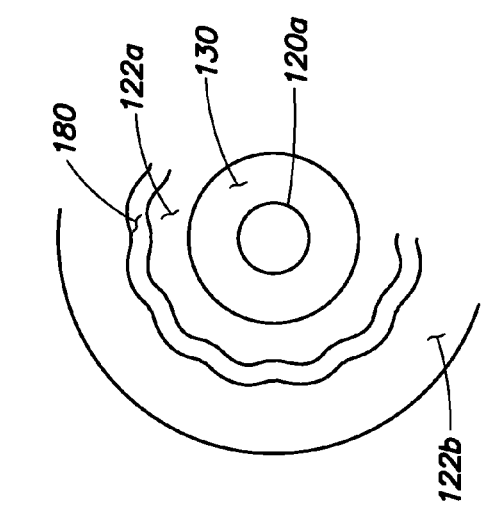
FIG. 3d is a partial bottom view of a surface mountable spark gap device in accordance with another embodiment of the present invention in which the spark gap has a jagged contour.

Although the surface topography of the edges of the spark gap 180 in the embodiment illustrated in FIG. 2 is generally smooth in contour, it should be appreciated the present invention is not so limited. Indeed, Applicants have empirically determined that other embodiments in which the outer edges of the spark gap 180 have some degree of surface variation may alternatively be used. For example, the outer edges of the spark gap 180 may have a scalloped contour as depicted in FIG. 3c, or a jagged contour as shown in FIG. 3d, while still maintaining a generally arcuate shape that avoids the presence of sharp edges or corners.

In accordance with one embodiment of the present invention, the contacts 140, 150 may be formed from copper pillars with a solder tip. The copper pillars forming the peripheral contact 150 may be suitably shaped and closely spaced, such that during a subsequent reflow operation where the spark gap device 100 is bonded to the PCB 160, a continuous bond is formed around the periphery of the spark gap device 100 sealing the cavity 170. Alternatively, to ensure a substantially air-tight seal around the periphery of the spark gap device 100, the peripheral contact 150 may be formed by electroplating a continuous strip of metal, such as copper, on the outer edge 122c of the peripheral portion 120b of the metal layer 120. The continuous strip of metal may tipped with a layer of solder that may then be reflowed to bond the spark gap device 100 to the PCB 160. In other embodiments, the contacts 140, 150 may be formed from solder balls dropped in location (i.e., by solder bumping), which may then be reflowed to bond the spark gap device 100 to a suitable mounting surface. In still other embodiments, the contacts 140, 150 may be formed from gold-stud bumps, and then bonded to the PCB or other mounting substrate by a thermosonic GGI (gold-gold interconnect) process. Alternatively still, a conductive epoxy could also be used to bond the contacts 140, 150 of the spark gap device 100 to a mounting surface, such as the PCB 160.

FIG. 2 illustrates the generally coaxial construction of the surface mountable spark gap device of FIG. 1, prior to formation of the central contact 140 and the peripheral contact 150. As shown in FIG. 2, a first electrode of the spark gap device 100 is formed from the central portion 120a of the metal layer 120, and a second electrode of the spark gap device 100 is formed from the peripheral portion 120b of the metal layer 120. In use, the central contact 140 would typically be electrically connected to an input of a circuit to be protected from a lightning strike or other ESD event (e.g., to an RF antenna port of a wireless device), and the peripheral contact 150 would typically be electrically connected to ground. Between the central portion 120a and the peripheral portion 120b of the metal layer 120 is the spark gap 180 that, as depicted in FIG. 2, coaxially surrounds the central portion 120a of the metal layer 120. As depicted in FIG. 2, the metal layer 120 is removed, typically by masking and then etching exposed portions of the metal layer 120, down to the surface of the insulating layer 115 (or to the surface of the substrate in those embodiments where no insulating layer 115 is present) to form the spark gap 180 that electrically separates the central portion 120a from the peripheral portion 120b. It should be appreciated that the central portion 120a of the metal layer 120 and the peripheral portion 120b of the metal layer 120 could alternatively be formed as separate structures that are formed at different times, with the spark gap 180 there between.

As shown in FIG. 2, the solder resist layer 130 is disposed on top of metal layer 120 except in those regions (e.g., openings) where contacts 140, 150 are to be formed, and at the outer peripheral edge 122a of the central portion 120a of the metal layer 120 and the inner peripheral edge 122b of the peripheral portion 120b of the metal layer 120. As depicted in FIG. 2, the outer edge 122c of the exposed region of the peripheral portion 120b of the metal layer 120 where the peripheral contact 150 is formed has a generally square shape. This allows for a number of discrete surface mountable spark gap devices to be co-formed on a common substrate and separated by scribe lines or scribe "streets" (not shown) for ease of subsequent singulation. It should be appreciated that the outer edge 122c of the exposed region of the peripheral portion 120b of the metal layer 120 where the peripheral contact 150 is formed may have other than a generally square shape, as the present invention is not limited to any particular shape.

Although embodiments of the present invention are not limited to the coaxial design depicted in FIGS. 1 and 2, applicants have determined that the combination of the coaxial design of the electrodes of the spark gap device 100 and the substantially circular spark gap 180 tends to spread out the current and reduce the extent of damage to the metal layer 120 during lightning strikes or multiple ESD events, thereby increasing the durability of the spark gap device 100. Moreover, the use of semiconductor fabrication techniques to form the spark gap device provides the ability to form the various layers of the spark gap device with great accuracy using conventional semiconductor fabrication equipment.

Figure 4:
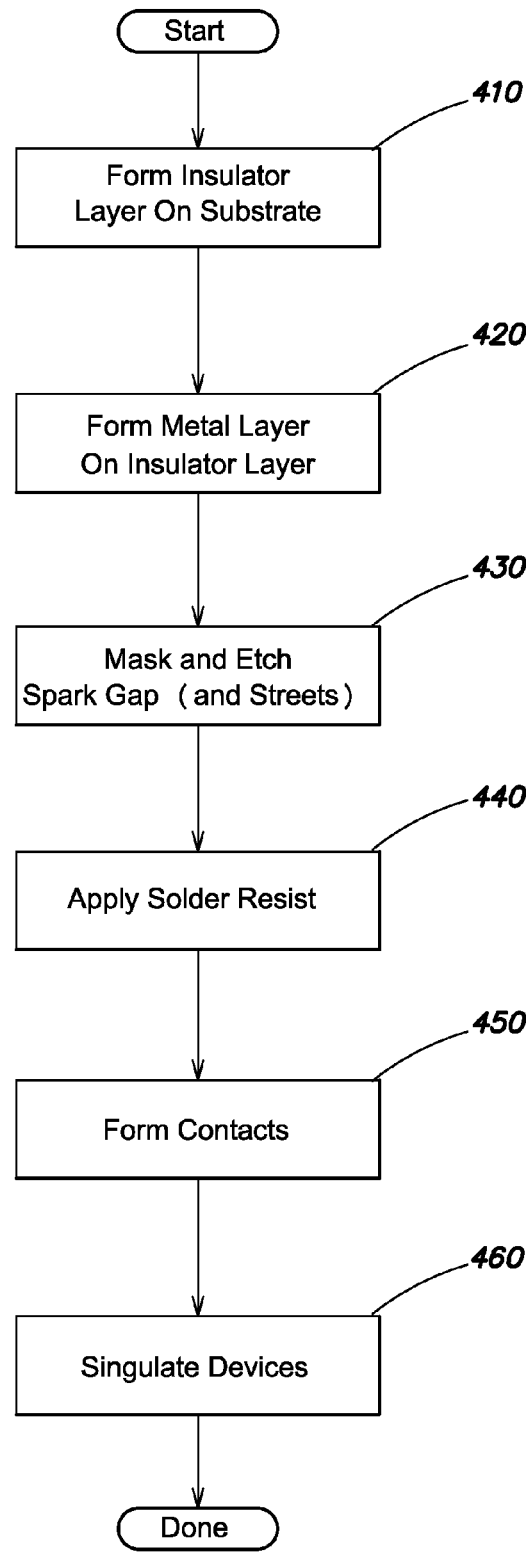
FIG. 4 is a flow chart illustrating a method of forming a surface mountable spark gap device in accordance with an embodiment of the present invention.

FIG. 4 is a flow chart illustrating a method of forming a surface mountable spark gap device in accordance with an embodiment of the present invention. In act 410, an optional insulating layer 115 having a thickness of between approximately 1-20 microns (1-20μ meters) is formed on a surface of a substrate 110, such as semi-insulating silicon. As previously described, in one embodiment, the insulating layer may be formed by growing a layer of silicon dioxide on the surface of a silicon substrate 110 having a thickness of approximately 10 microns (10μ meters). Alternatively, if the substrate 110 is insulative (e.g., ceramic or glass), step 410 may be skipped.

In act 420, a metal layer 120 is formed on an exposed surface of the insulating layer 115 (or an exposed surface of the substrate 110 if no insulating layer 115 is present). As previously described, in one embodiment, the metal layer 120 may be formed by electroplating a layer of metal or a mixture of metals having a relatively high melting temperature, such as a mixture of titanium and tungsten, having a thickness of approximately 1 micron (1μ meter) or more on the exposed surface of the insulating layer 115 or substrate 110, as described above. It should be appreciated that where multiple surface mountable spark gap devices 100 are to be formed on a common substrate, the insulating layer 115 and the metal layer 120 may correspond to multiple spark gap devices.

In act 430, a portion of the metal layer 120 is removed to define the central portion 120a of the metal layer 120, the peripheral portion 120b of the metal layer 120, and the spark gap 180 there between. During act 430, street regions (not illustrated) between individual surface mountable spark gap devices may also be formed. As well known to those skilled in the art, act 430 may include applying a layer of photoresist to an exposed surface of the metal layer 120, patterning the photoresist layer to define the spark gap 180 and the streets between individual surface mountable spark gap devices, exposing the patterned photoresist layer to light, rinsing away the photoresist from the regions defining the spark gap 180 and the streets, and then etching the metal layer down to the insulating layer 115.

In act 440, a solder resist having a thickness of approximately 0.5-10 microns (0.5-10μ meters) is applied to the exposed surface of the metal layer 120, and then a portion thereof removed, such as by patterning, exposing to light, and then rinsing, to form the solder resist layer 130. As described previously, the solder resist layer 130 covers the surface of the metal layer 120 except in those regions defining the locations of the contacts 140, 150, and, where desired, near the outer edge 122a of the central portion 120a of the metal layer 120 and near the inner edge 122b of the peripheral portion 120b of the metal layer 120. As previously described, in one embodiment, the solder resist layer 130 is approximately 1 micron (1μ meter) thick, and is formed from a layer of polymer, such as SUB. Other materials that may be used to form the solder resist layer 130 include Benzocyclobutene-based polymers (BCB-based polymers), silicon-nitride, or spin-on-glass (SOG).

In act 450 contacts 140 and 150 are formed on an exposed surface of the metal layer 120. As previously described, the contacts may be formed from copper pillars with a solder tip, as known in the art, by solder bumping, or by other processes (e.g., by gold stud bumping, etc.)

In act 460 the substrate 110 may be singulated along the streets formed in act 430 to form a plurality of individual surface mountable spark gap devices that may subsequently be bonded to a PCB 160 or other mounting substrate.

Figure 5:
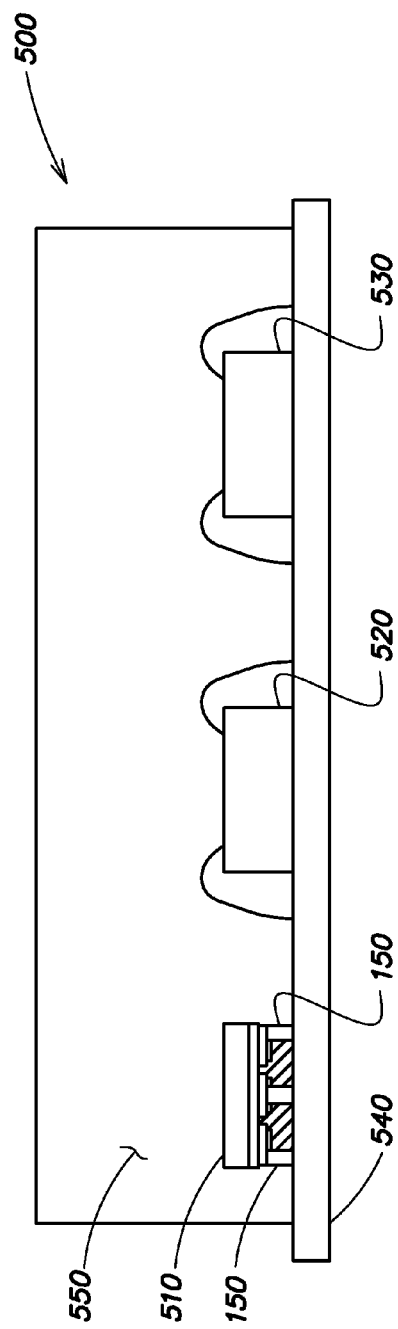
FIG. 5 illustrates a cross-sectional view of a multi-chip module in accordance with the present invention that includes a surface mountable spark gap device.

FIG. 5 illustrates a cross-sectional view of a multi-chip module (MCM) in accordance with the present invention that includes a surface mountable spark gap device. As shown in FIG. 5, the MCM 500 includes a surface mountable spark gap device 510, and one or more other integrated circuit devices 520, 530, that as shown, are wire-bonded to contacts (not shown) formed on a top surface of a multi-chip module mounting substrate 540. Although not visible in FIG. 5, the contacts 140, 150 (FIG. 1) of the spark gap device 510 are electrically and mechanically bonded to suitably disposed contacts formed on the top surface of the multi-chip module mounting substrate 540. The integrated circuit device 520 may, for example be a switch or a filter such as a bandpass filter or a low pass filter, and the integrated circuit device 530 could be an amplifier, such as a low noise amplifier or a power amplifier. Although not shown, the integrated circuit devices 520, 530 may alternatively be electrically connected to the mounting substrate 540 by techniques other than wire bonding, such as Ball Grid Array (BGA) bonding, copper pillar bump bonding, gold bump bonding, conventional surface mount bonding, etc. The multi-chip module mounting substrate 540 may be formed from a semiconductor substrate, a printed circuit board, or any other type of mounting substrate known in the art. Although not shown, contacts formed on the underside of mounting substrate 540 could be used to connect the MCM 500 to other circuitry in a well-known manner.

As illustrated in FIG. 5, the surface mountable spark gap device 510 and the other integrated circuit devices 520, 530 are encapsulated in a molding compound 550, such as an epoxy. The molding compound 550 helps to seal the electronic devices 510, 520, 530 from the ambient environment and also provides a more mechanically robust structure that can be handled as a single unit. As illustrated in FIG. 5, the peripheral contact 150 extends around the periphery of the surface mountable spark gap device 510 to seal in air (or another gas such as an inert gas, or a vacuum environment) inside the device 510 and to prevent the ingress of mold compound 550 into the cavity 170 and thus, into the spark gap 180 of the device 510.

It should be appreciated that by avoiding the presence of any molding compound 550 or other material (such as solder resist 130) within the space defining the spark gap 180, embodiments of the present invention thereby lower the voltage at which a spark forms and current flows between the two electrodes of the spark gap device during a lightning strike or other ESD event. This is because gaseous dielectric materials, such as air, generally spark over at a lower voltage than solid dielectric materials, such as silicon dioxide, glass, etc. Moreover, the presence of a gaseous dielectric material within the space defining the spark gap, rather than a solid dielectric material, such as molding compound 550, reduces the likelihood of burning or charring during a lightning strike or other ESD event. Although the surface mountable spark gap device 510 illustrated in FIG. 5 is molded together with other integrated circuits (i.e., integrated circuits 520, 530), it should be appreciated that the surface mountable spark gap device 510 may be individually attached to a mounting substrate 540, encapsulated with molding compound 550, and provided as a discrete protection device. Indeed, in certain embodiments, the surface mountable spark gap device 510 may be bonded to a PCB or other mounting substrate 540, for example, by soldering, or by a conductive epoxy without any encapsulation within molding compound 550. In such embodiments, the bonding of the surface mountable spark gap device 510 to the mounting substrate 540 serves to create a seal around the periphery of the surface mountable spark gap device 510 that protects the spark gap 180 from environmental contaminants, such as moisture, dirt, cleaning agents, etc.

In accordance with one embodiment of the present invention in which the surface mountable spark gap device is formed on a semi-insulating silicon substrate, the metal layer 120 is approximately 1 micron (1μ meter) thick, the spark gap 180 is approximately 8 microns (8μ meters) wide and the cavity 170 is filled with air, the spark gap device 100 sparks over at a voltage of approximately 300 volts. It should be appreciated that by reducing the width of the spark gap 180, this voltage may be reduced, and by increasing the width of the spark gap, this voltage may be increased.

Figure 6:
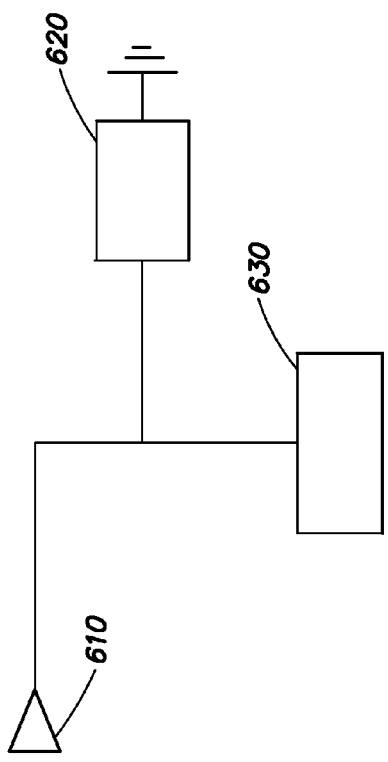
FIG. 6 is a schematic diagram illustrating the manner in which a surface mountable spark gap device may be used in an electrical circuit.

FIG. 6 is a schematic diagram illustrating the manner in which a surface mountable spark gap device may be used in an electrical circuit. As shown, the surface mountable spark gap device 620 is electrically connected to an input of the circuit, such as an RF antenna 610 to protect downstream circuitry 630 from the affects of a lightning strike or other type of ESD event. For example, the central contact 140 (FIG. 1) of the surface mountable spark gap device 620 could be electrically connected to the antenna 610, and the peripheral contact 150 (FIG. 1) of the surface mountable spark gap device 620 could be electrically connected to ground to protect the downstream circuitry 630. Advantageously, the antenna 610, the surface mountable spark gap device 620 and the downstream circuitry 630 may be packaged as a unitary structure, such as the multi-chip module 500 shown in FIG. 5, and integrated into another device, such as a cellular phone.

Having now described some illustrative aspects of the invention, it should be apparent to those skilled in the art that the foregoing is merely illustrative and not limiting, having been presented by way of example only. Numerous modifications and other illustrative embodiments are within the scope of one of ordinary skill in the art and are contemplated as falling within the scope of the invention.

What is claimed is:

1. A spark gap device comprising:
   a substrate;
   a metal layer formed over the substrate, the metal layer including a central portion and a peripheral portion that are separated by a gap where no metal from the metal layer is present, the gap surrounding the central portion of the metal layer;
   a solder resist layer disposed on an exposed surface of the metal layer, the solder resist layer including a central portion disposed on the central portion of the metal layer and a peripheral portion disposed on the peripheral portion of the metal layer, the central portion of the solder resist layer including a first opening exposing a central region of the central portion of the metal layer and the peripheral portion of the solder resist layer including a second opening exposing a peripheral region of the peripheral portion of the metal layer;
   a first contact formed in the first opening of the solder resist layer and contacting the central region of the central portion of the metal layer; and
   a second contact formed in the second opening of the solder resist layer and contacting the peripheral region of the peripheral portion of the metal layer.

2. The spark gap device of claim 1 wherein the central portion of the metal layer is substantially circular in shape.

3. The spark gap device of claim 2 wherein the gap is substantially circular in shape and coaxially surrounds the central portion of the metal layer, and the peripheral portion of the metal layer coaxially surrounds the central portion of the metal layer and the gap.

4. The spark gap device of claim 3 wherein the gap has a width of between approximately 6 to 10 microns (6-10μ meters).

5. The spark gap device of claim 3 wherein the metal layer has a thickness of approximately 1 micron (1μ meter) or more and is formed from one of pure titanium, pure tungsten, pure nickel, platinum, and a mixture of titanium and tungsten.

6. The spark gap device of claim 3 wherein the substrate is formed from one of a semiconductor material, a ceramic material, and glass.

7. The spark gap device of claim 3 wherein the first and second contacts are formed from copper pillars with a solder tip.

8. The spark gap device of claim 3 wherein the solder resist layer is formed from SU8 polymer and has a thickness of between approximately 0.5-10 microns (0.5-10μ meters).

9. The spark gap device of claim 3 wherein the substrate is formed from a semiconductor material, the spark gap device further comprising:
   an insulating layer formed on a surface of the substrate between the substrate and the metal layer, the insulating layer being formed from silicon dioxide and having a thickness of between approximately 1-20 microns (1-20μ meters), the gap exposing the insulating layer.

10. The spark gap device of claim 1 wherein the spark gap device is mounted to a mounting substrate, the mounting substrate including a first contact that is electrically connected to the first contact of the semiconductor spark gap device and a second contact that is electrically connected to the second contact of the semiconductor spark gap device, the second contact of the spark gap device surrounding a periphery of the substrate of the spark gap device and, together with the second contact of the mounting substrate, forming a substantially air-tight seal.

11. The spark gap device of claim 10 wherein a cavity is defined between the first contact of the spark gap device and the second contact of the spark gap device and the cavity is filled with one of air, an inert gas, or a vacuum.

12. The spark gap device of claim 11 further comprising:
   an insulating layer formed on a surface of the substrate between the substrate and the metal layer, the central portion of the metal layer forming a first electrode of the spark gap device, the peripheral portion of the metal layer forming a second electrode of the spark gap device, and current conduction between the first electrode and the second electrode occurring at approximately 300 volts.

13. The spark gap device of claim 11 wherein the spark gap device is encapsulated in a molding compound and the second contact of the spark gap device prevents the ingress of the molding compound into the gap.

14. The spark gap device of claim 13 wherein the spark gap device and the mounting substrate form a portion of a multi-chip module and the multi-chip module includes at least one additional integrated circuit mounted to the mounting substrate and encapsulated within the molding compound.

15. A method of forming a spark gap device comprising acts of:
   forming a metal layer over a substrate;

removing a portion of the metal layer to define a substantially circular gap where no metal from the metal layer is present, the gap surrounding a central portion of the metal layer and separating the central portion of the metal layer from a peripheral portion of the metal layer that coaxially surrounds the gap;

forming a solder resist layer on an exposed surface of the central portion of the metal layer and the peripheral portion of the metal layer;

removing a portion of the solder resist layer to expose a central region of the central portion of the metal layer and a peripheral region of the peripheral portion of the metal layer;

forming a first contact on the exposed central region of the central portion of the metal layer to provide a first electrode for the spark gap device; and forming a second contact on the exposed peripheral region of the peripheral portion of the metal layer to provide a second electrode for the spark gap device.

16. The method of claim 15 wherein the act of removing the portion of the metal layer defines a gap having a width of approximately 6 to 10 microns.

17. The method of claim 16 wherein the act of forming the metal layer includes electroplating the metal layer to a thickness of approximately 1 micron or more.

18. The method of claim 16 further comprising an act of adjusting the width of the gap to adjust a voltage at which current will be conducted between the first electrode and the second electrode of the spark gap device during a lightning strike or other type of ESD event.

19. The method of claim 15 further comprising acts of:

mounting the spark gap device to a mounting substrate having a first central contact and a second peripheral contact;

forming a first electrical connection between the first contact of the spark gap device and the first central contact of the mounting substrate; and forming a second electrical connection between the second contact of the spark gap device and the second peripheral contact of the mounting substrate, the act of forming the second electrical connection forming a substantially airtight seal around a periphery of the spark gap device.

20. The method of claim 19 further comprising an act of:

forming an insulating layer on a surface of the substrate;

wherein the act of forming the metal layer over the substrate includes forming the metal layer on an exposed surface of the insulating layer and the act of removing the portion of the metal layer includes removing the portion of the metal layer down to the insulating layer.

* * * * *